US012617907B2

(12) United States Patent
Saito et al.

(10) Patent No.: US 12,617,907 B2
(45) Date of Patent: May 5, 2026

(54) RESIN COMPOSITION, PREPREG USING SAME, FILM PROVIDED WITH RESIN, METAL FOIL PROVIDED WITH RESIN, METAL-CLAD LAMINATE, AND WIRING BOARD

(71) Applicant: PANASONIC INTELLECTUAL PROPERTY MANAGEMENT CO., LTD., Osaka (JP)

(72) Inventors: Hirosuke Saito, Osaka (JP); Yiqun Wang, Osaka (JP); Hiroharu Inoue, Osaka (JP); Yasunori Nishiguchi, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 186 days.

(21) Appl. No.: 18/290,279

(22) PCT Filed: May 12, 2022

(86) PCT No.: PCT/JP2022/020115

§ 371 (c)(1),
(2) Date: Nov. 10, 2023

(87) PCT Pub. No.: WO2022/239845

PCT Pub. Date: Nov. 17, 2022

(65) Prior Publication Data

US 2024/0239974 A1 Jul. 18, 2024

(30) Foreign Application Priority Data

May 13, 2021 (JP) ................................. 2021-081741

(51) Int. Cl.
*C08J 5/18* (2006.01)
*C08J 5/24* (2006.01)
(Continued)

(52) U.S. Cl.
CPC . *C08J 5/18* (2013.01); *C08J 5/24* (2013.01); *C08K 5/5313* (2013.01); *H05K 1/0353* (2013.01)

(58) Field of Classification Search
CPC .. C08J 5/18; C08J 5/24; C08K 5/5313; H05K 1/0353
See application file for complete search history.

(56) References Cited

U.S. PATENT DOCUMENTS

2009/0258997 A1 10/2009 Lin et al.
2010/0016585 A1* 1/2010 Lin .................. C07F 9/657172 568/14

(Continued)

FOREIGN PATENT DOCUMENTS

JP 2008-214427 A 9/2008
JP 2009-263363 A 11/2009

(Continued)

OTHER PUBLICATIONS

ISR issued in International WIPO Patent Application No. PCT/JP2022/020115, Aug. 2, 2022, translation.

*Primary Examiner* — Maria V Ewald
*Assistant Examiner* — Ethan Weydemeyer
(74) *Attorney, Agent, or Firm* — GREENBLUM & BERNSTEIN, P.L.C.

(57) ABSTRACT

A resin composition includes:
a compound (A) represented by the following formula

X—Y wherein X is 9,10-dihydro-9-oxa-10-phospha-phenanthrene-10-yl-10-oxide and Y is a protecting group;

(Continued)

and a thermosetting resin (B) containing at least one selected from among an epoxy resin, a polyphenylene ether resin, a cyanate ester resin, a phenol resin, an active ester resin, a benzoxazine resin, a maleimide resin, an acrylic resin, a methacrylic resin, a vinyl resin, an allyl resin, a propenyl resin, and a hydrocarbon-based resin having an unsaturated double bond.

9 Claims, 5 Drawing Sheets

(51) Int. Cl.

| | |
|---|---|
| ***C08K 5/5313*** | (2006.01) |
| ***H05K 1/03*** | (2006.01) |

(56) References Cited

U.S. PATENT DOCUMENTS

| | | | | |
|---|---|---|---|---|
| 2012/0116078 | A1 | 5/2012 | Lin et al. | |
| 2015/0056454 | A1 | 2/2015 | Takada et al. | |
| 2016/0060429 | A1 * | 3/2016 | Kitai | C08L 63/00 523/451 |
| 2022/0169852 | A1 | 6/2022 | Taki et al. | |

FOREIGN PATENT DOCUMENTS

| | | | |
|---|---|---|---|
| JP | 2011-046816 | A | 3/2011 |
| JP | 2011-052165 | A | 3/2011 |
| JP | 5215254 | B2 | 6/2013 |
| WO | 2013/137257 | A1 | 9/2013 |
| WO | 2015/064064 | A1 | 5/2015 |
| WO | 2020/204175 | A1 | 10/2020 |

* cited by examiner

RESIN COMPOSITION, PREPREG USING SAME, FILM PROVIDED WITH RESIN, METAL FOIL PROVIDED WITH RESIN, METAL-CLAD LAMINATE, AND WIRING BOARD

TECHNICAL FIELD

The present invention relates to a resin composition, and a prepreg using the same, a film provided with resin, a metal foil provided with resin, a metal-clad laminate, and a wiring substrate obtained using the resin composition.

BACKGROUND ART

In recent years, along with an increased amount of information processed, various electronic devices have rapidly progressed in mounting technologies such as higher integration of semiconductor devices to be mounted, higher density for wiring, and multi-layering. A thermosetting resin is generally used as a substrate material for constituting a base material of a wiring board used in various electronic devices, and is required to have high heat resistance (glass transition temperature) in order to respond to multilayering and a high temperature condition in a process such as reflow, and also required to have a low dielectric constant and a low dielectric loss tangent in order to increase a signal transmission speed and reduce a loss during signal transmission.

Since a substrate material for a printed wiring board or a semiconductor package is required to have high flame retardancy, a flame retardant is generally added to a resin composition used as an insulating material of the substrate material. As the flame retardant, a halogen-based flame retardant such as a bromine-based flame retardant and the like are also known, but a cured product of such resin composition containing a halogen may produce a harmful substance such as hydrogen halide at the time of combustion, and has a disadvantage of negatively affecting humans and the natural environment. Because of this situation, an insulating material for printed wiring boards also are required to be halogen-free.

A phosphorus-based flame retardant known as a non-halogen flame retardant is assumed to exhibit a flame retardant effect by the promotion effects of a phosphorus compound on the carbonization of a synthetic resin to turn the surface thereof into a char layer during combustion thereby shielding thermal energy of an ignition source or shielding air required for combustion.

It has been reported that flame retardancy can be secured with retaining the performance as a printed wiring board to some extent by adding a predetermined phosphorus compound to a thermosetting resin such as a PPE compound or a maleimide compound (Patent Documents 1 to 3 etc.).

However, in the case of a conventional non-halogen flame retardant, a large amount of flame retardant is required to be used in order to ensure sufficient flame retardancy, which has resulted in a possibility that the glass transition temperature (Tg) may decrease in the cured product of the resin composition or the dielectric properties may be insufficient. Moreover, there is also an actual situation in which there is being demanded a resin composition with a novel flame retardant having a flame retardant effect, which is different from the conventional non-halogen flame retardants, suitable for higher functionality of substrate materials in recent years.

The present invention is made in view of such circumstances, and an object of the present invention is to provide a resin composition which has flame retardancy equal to or higher than that of a conventional resin composition containing a phosphorus-based flame retardant, and retains performances as a wiring board such as low dielectric properties and a high glass transition temperature (Tg), or has higher performance.

CITATION LIST

Patent Literatures

Patent Literature 1: JP 2011-46816 A
Patent Literature 2: WO 2020/204175 A
Patent Literature 3: JP 2011-52165 A

SUMMARY OF INVENTION

A resin composition according to one aspect of the present invention is characterized by including a compound (A) represented by the following formula:

X—Y wherein X is 9,10-dihydro-9-oxa-10-phosphaphenanthrene-10-yl-10-oxide and Y is a protecting group; and a thermosetting resin (B) containing at least one selected from among an epoxy resin, a polyphenylene ether resin, a cyanate ester resin, a phenol resin, an active ester resin, a benzoxazine resin, a maleimide resin, an acrylic resin, a methacrylic resin, a vinyl resin, an allyl resin, a propenyl resin, and a hydrocarbon-based resin having an unsaturated double bond.

DESCRIPTION OF EMBODIMENTS

Figure 1:
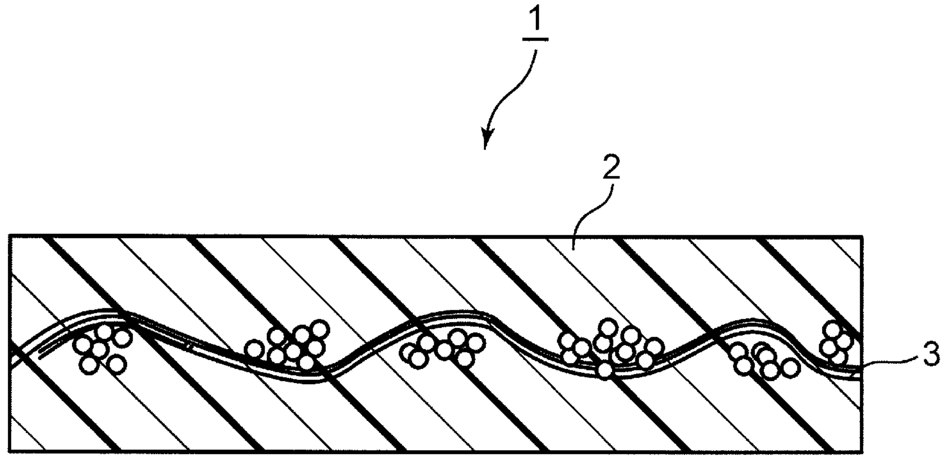
FIG. 1 is a schematic sectional view illustrating the configuration of a prepreg according to an embodiment of the present invention.

A resin composition according to an embodiment of the present invention (hereinafter, it is also simply referred to as a resin composition) is characterized by containing a compound (A) represented by the following formula:

X—Y wherein X is 9,10-dihydro-9-oxa-10-phosphaphenanthrene-10-yl-10-oxide and Y is a protecting group; and a thermosetting resin (B) containing at least one selected from among an epoxy resin, a polyphenylene ether resin, a cyanate ester resin, a phenol resin, an active ester resin, a benzoxazine resin, a maleimide resin, an acrylic resin, a methacrylic resin, a vinyl resin, an allyl resin, a propenyl resin, and a hydrocarbon-based resin having an unsaturated double bond.

According to the configuration set forth above, it is possible to provide a resin composition which exhibits high flame retardancy even though it does not contain a halogen atom, and has characteristics such as low dielectric properties and a high glass transition temperature (Tg).

It is considered that in the resin composition of the present embodiment is thought to generate radicals when the protecting group is cleaved from the compound (A), and the flame retardant effect is exhibited by the flame extinguishing effect by the stable radicals.

Therefore, according to the present invention, it is possible to provide a resin composition which exhibits high flame retardancy without containing a halogen atom and has characteristics such as low dielectric properties and high Tg in a cured product thereof. In addition, by using the resin composition, it is possible to provide a prepreg, a film with resin, a metal foil with resin, a metal-clad laminate, and a wiring board having characteristics such as high flame retardancy, low dielectric properties, and high Tg.

Hereinafter, there will be specifically described each component in the resin composition according to the present embodiment.

<Compound (A)>

The compound (A) according to the present embodiment is a compound represented by the following formula:

X—Y wherein X is 9,10-dihydro-9-oxa-10-phosphaphenanthrene-10-yl-10-oxide and Y is a protecting group.

In general, it is known that a compound that is easily homogeneously cleaved, such as an organic peroxide, has a low decomposition temperature, and the compound is inappropriate to be added as a flame retardant to various synthetic resins. On the contrary, it is considered that a very high flame retardant effect can be obtained in the case of the compound (A) of the present embodiment, since the decomposition temperature at which stable radicals are generated is higher than 200° C.

In addition, the resin composition of the present embodiment contains the compound (A) and is advantageous not only in flame retardancy but also in that a cured product thereof has high Tg and low dielectric properties.

The compound (A) is a compound having at least one selected from 9,10-dihydro-9-oxa-10-phosphaphenanthrene-10-yl-10-oxide. Since the compound having a group like this exhibits a radical trapping effect, it is considered that a higher flame retardancy effect can be obtained.

In addition, the protecting group included in the compound (A) refers to a substituent that is temporarily introduced into a specific functional group in a compound having a functional group thereby inactivating reactivity of the compound on the premise that the protecting group is eliminated at a later stage, as a result of this the chemical stability of the compound is enhanced. In the present embodiment, the later stage refers to the time when the resin composition containing the compound is combusted.

As the protecting group used in the present embodiment, any protecting group can be used without any particular problem as long as it is introduced with use of a protecting reagent. Such protective reagents refer to those generally available (e.g., commercially available) or those derived by a synthesizable protective reagent.

Specifically, examples of the protecting group Y include: silyl group, acyl group, allyl group, allyloxycarbonyl group, benzyl group, benzyloxycarbonyl group, acetal group, thioacetal group, 2,2,2-trichloroethoxycarbonyl group, alkoxymethyl group, tert-butoxycarbonyl group, 9-fluorenylmethyloxycarbonyl group, trityl group, and sulfonyl group. In particular, among these groups, the group is preferable such that the total molecular weight of the compound of the formula (1) is 250 or more, and when the bond between X and Y is cleaved, as with the radical atom of X, the radical atom of Y is also a group is stabilized by resonance with at least one adjacent aromatic ring to easily generate a stable radical.

Furthermore, the protecting group Y is preferably a group represented by the following formula (1).

[Chemical formula 1]

(1)

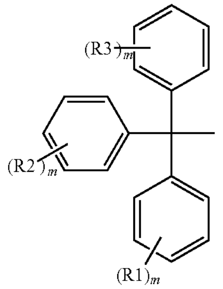

In the formula (1), R1, R2, and R3 each independently represent a hydrogen atom, a benzoyloxy group, a vinylbenzyl group, an alkoxy group with 1 to 6 carbon atoms, or an alkenyl group with 2 to 6 carbon atoms, and the subscript "m" each independently represents an integer from 1 to 5.

When the protecting group Y in the compound (A) is a group represented by the formula (1), it is considered that each radical atom generated by cleavage of the organic compound is stabilized by resonance with at least one aromatic ring on one side (on the side of X) and three aromatic rings on the other side (on the side of protecting group Y), so that cleavage into a radical pair proceeds more smoothly. Therefore, the above-described flame retardant effect can be more reliably exhibited.

More specific examples of the group represented by the formula (1) include: trityl group, 4-methoxytrityl group, 4,4'-dimethoxytrityl group, and 4,4',4"-tris(benzoyloxy)trityl group.

For example, when the protecting group is a trityl group, the compound (A) of the present embodiment is as follows (provided that, compounds (1-2) to (1-4) other than compound (1-1) each are a reference compound):

[Chemical formula 2]

(1-1)

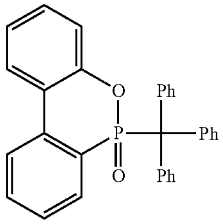

-continued (1-2)

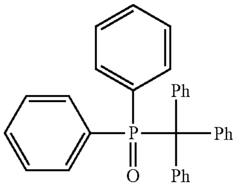

(1-3)

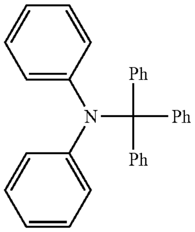

(1-4)

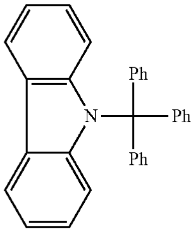

For example, when the protecting group is a 4-methoxytrityl group, the compound (A) of the present embodiment is as follows (provided that, compounds (2-2) to (2-4) other than compound (2-1) each are a reference compound):

[Chemical formula 3]

(2-1)

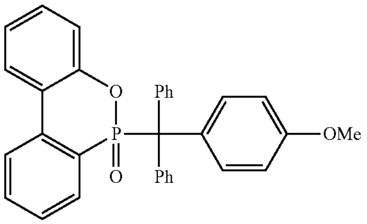

(2-2)

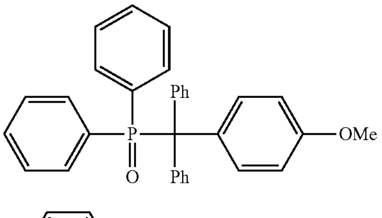

(2-3)

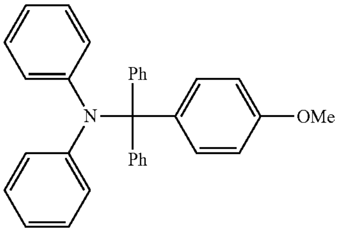

-continued (2-4)

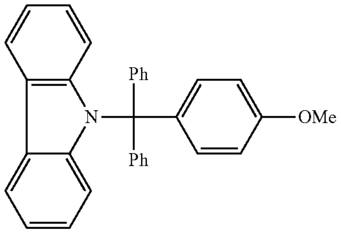

For example, when the protecting group is a 4,4'-dimethoxytrityl group, the compound (A) of the present embodiment is as follows (provided that, compounds (3-2) to (3-4) other than compound (3-1) each are a reference compound):

[Chemical formula 4]

(3-1)

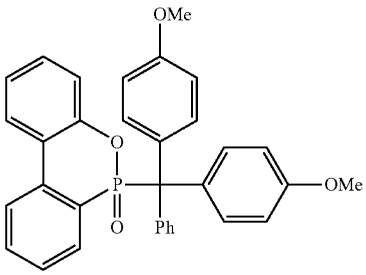

(3-2)

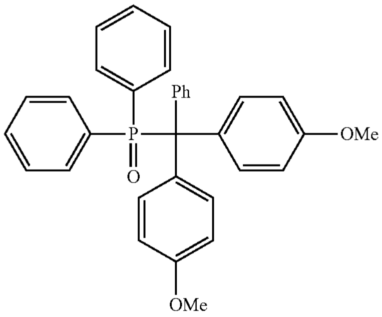

(3-3)

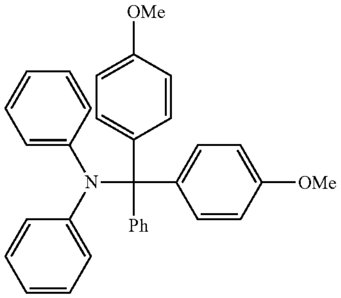

-continued (3-4)

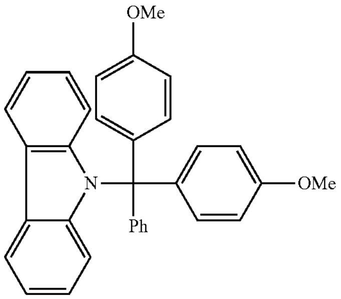

Furthermore, when the protecting group is a 4,4',4"-tris (benzoyloxy)trityl group, the compound (A) of the present embodiment is as follows (provided that, compounds (4-2) to (4-4) other than compound (4-1) each are a reference compound):

[Chemical formula 5]

(4-1)

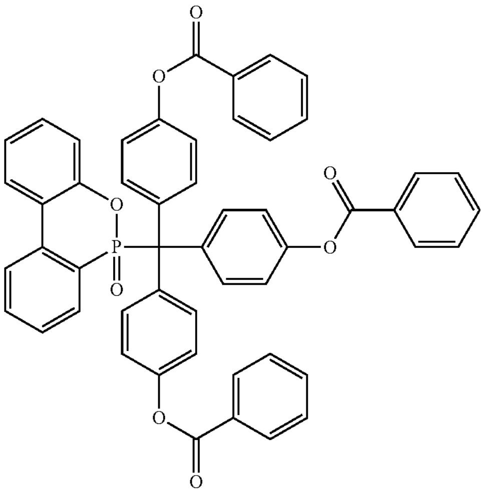

(4-2)

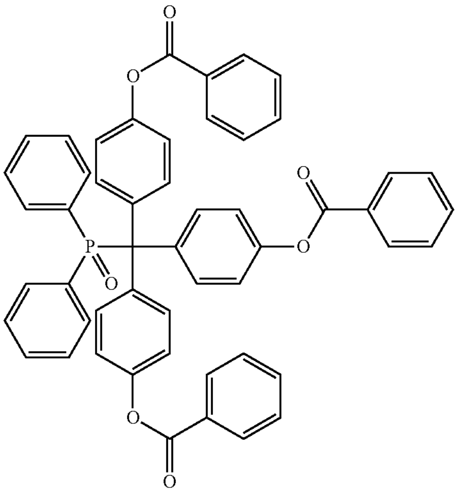

-continued (4-3)

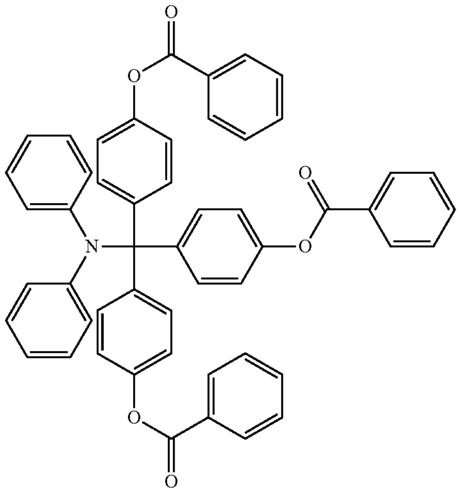

(4-4)

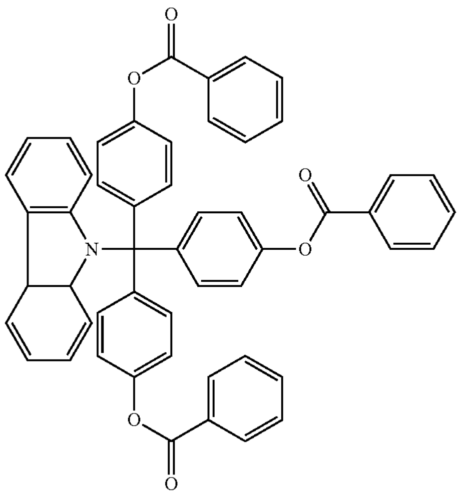

The compound (A) of the present embodiment preferably has a weight average molecular weight of 250 or more. As a result, the compound (A) is also advantageous in that volatility can be suppressed even when added and mixed into a synthetic resin at high temperature and the addition effect thereof can be sufficiently exhibited. Furthermore, the weight average molecular weight of the compound (A) is more preferably 300 or more, still more preferably 400 or more. The upper limit of the molecular weight is not particularly limited, but is preferably 1000 or less, and more preferably 900 or less from the viewpoint of the number of radical sources per molecular weight.

The method of synthesizing the compound (A) of the present embodiment is not particularly limited, but for example, the compound (A) of the present embodiment can be obtained by a condensation reaction between the compound X (9,10-dihydro-9-oxa-10-phosphaphenanthrene-10-yl-10-oxide) and a protective reagent having a group that specifically reacts with a functional group in the compound X in the presence or absence of a base. Specific examples of the protective reagent that can be used include: 4-methoxytrityl chloride, 4,4'-dimethoxytrityl chloride, and 4,4',4"-tris(benzoyloxy)trityl bromide.

<Thermosetting Resin (B)>

The thermosetting resin (B) used in the present embodiment is not particularly limited as long as it is a thermosetting resin that can be used as a wiring board material, and specifically, examples thereof include: epoxy resin, polyphenylene ether resin, cyanate ester resin, phenol resin, benzoxazine resin, active ester resin, and resins having an unsaturated group. Examples of the resin having an unsaturated group include: acrylic resin, methacrylic resin, vinyl resin, allyl resin, propenyl resin, maleimide resin, and hydrocarbon-based resins having an unsaturated double bond, and at least one of these resins is preferably to be contained.

Among them, it is more preferable to use a resin whose cured product is capable of exhibiting a low dielectric constant, a low dielectric loss tangent, and a high Tg. Specifically, it is preferable to contain at least one selected from among a polyphenylene ether compound, a maleimide compound, and a hydrocarbon-based resin having an unsaturated double bond.

(Polyphenylene Ether Resin)

As the polyphenylene ether resin, for example, it is preferable to use a terminal-modified polyphenylene ether compound that can exhibit excellent low dielectric properties when cured, and it is further preferable to use a modified polyphenylene ether compound terminal-modified with a substituent having a carbon-carbon unsaturated double bond.

Examples of the substituent having a carbon-carbon unsaturated double bond include: a group having a styrene structure or a (meth)acrylate structure as represented by the following formula (2) or (3).

[Chemical formula 6]

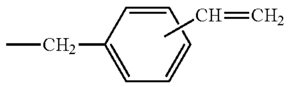

(2)

[Chemical formula 7]

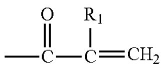

(3)

In the formula (3), $R_1$ represents a hydrogen atom or an alkyl group. The alkyl group is not particularly limited and is, for example, preferably an alkyl group with 1 to 18 carbon atoms and more preferably an alkyl group with 1 to 10 carbon atoms. Specifically, examples thereof include: methyl group, ethyl group, propyl group, hexyl group, and decyl group.

More specifically, examples of the substituent include: vinylbenzyl group (ethenylbenzyl group) such as p-ethenylbenzyl group and m-ethenylbenzyl group, vinylphenyl group, acrylate group, and methacrylate group.

It is considered that by using the modified polyphenylene ether compound like this, low dielectric properties such as low dielectric constant and low dielectric loss tangent and excellent heat resistance can be maintained and also higher Tg and adhesion can be enhanced.

Note that one kind of the modified polyphenylene ether compounds can be used singly, or two or more kinds thereof may be used in combination.

In the present embodiment, the weight average molecular weight (Mw) of the modified polyphenylene ether compound used as a thermosetting resin is not particularly limited, but is, for example, preferably from 1000 to 5000, more preferably from 1000 to 4000. Note that, the weight average molecular weight as used herein is preferably a measured value by a general molecular weight measuring method, and specifically, examples thereof include a value measured by gel permeation chromatography (GPC). When the modified polyphenylene ether compound includes repeating units (s, m, and n) in the molecule, these repeating units are preferably numerical values such that the modified polyphenylene ether compound has a weight average molecular weight within the range set forth above.

When the modified polyphenylene ether compound has a weight average molecular weight within the range set forth above, an excellent low dielectric properties that the polyphenylene ether skeleton has are exhibited, and a cured product thereof is not only excellent in heat resistance of but also excellent in moldability. This is considered to be due to the following. In comparison with a typical polyphenylene ether, the modified polyphenylene ether compound having a weight average molecular weight within a range set forth above has a relatively low molecular weight, and hence the heat resistance of the cured product tends to decrease. With this regard, the modified polyphenylene ether compound according to the present embodiment has a styrene structure or a (meth)acrylate structure at the terminal and hence has a high reactivity, and it is considered to afford a cured product whose heat resistance is sufficiently high. When the weight average molecular weight of the modified polyphenylene ether compound is within the range like this, the modified polyphenylene ether compound has a higher molecular weight than that of styrene or divinylbenzene but has a relatively lower molecular weight than that of typical polyphenylene ether, and hence it is considered that the modified polyphenylene ether compound is excellent in moldability as well. Therefore, the modified polyphenylene ether compound like this is considered to afford a cured product excellent not only in heat resistance but also excellent in moldability.

In the modified polyphenylene ether compound used as the thermosetting resin in the present exemplary embodiment, the average number of the substituents (the number of terminal functional groups) included at the molecular terminal per molecule of the modified polyphenylene ether is not particularly limited. Specifically, the number of terminal functional groups is preferably from 1 to 5, more preferably from 1 to 3. When the number of terminal functional groups is too small, it tends to be difficult to obtain a cured product exhibiting sufficient heat resistance. When the number of terminal functional groups is too large, the reactivity is too high, and for example, there is a possibility that troubles such as a deterioration in storage stability of the resin composition and a decrease in fluidity of the resin composition may occur. In other words, when the modified polyphenylene ether like this is used, there is a concern of occurring moldability problems in which, for example, molding defects such as voids are generated during multilayer molding due to poor fluidity and the like, whereby a highly reliable printed wiring board is difficult to obtain.

Note that, as the number of terminal functional groups in the modified polyphenylene ether compound, there can be exemplified a numerical value representing the average value of the substituents per molecule of all modified polyphenylene ether compounds present in one mole of the modified polyphenylene ether compound. This number of terminal functional groups can be determined by, for example, calculating the decrease from the number of hydroxyl groups in the polyphenylene ether before modification to the number of hydroxyl groups remaining in the resulting modified polyphenylene ether compound. The number of hydroxyl groups decreased from the number of hydroxyl groups in the polyphenylene ether before modification is the number of terminal functional groups. In the method of measuring the number of hydroxyl groups remaining in the modified polyphenylene ether compound, a quaternary ammonium salt (tetraethylammonium hydroxide) to be associated with a hydroxyl group is added to a solution of the modified polyphenylene ether compound and the UV absorbance of the mixed solution is measured, whereby the number of hydroxyl groups can be determined.

The intrinsic viscosity of the modified polyphenylene ether compound used in the present embodiment is not particularly limited. Specifically, the intrinsic viscosity may be from 0.03 to 0.12 dl/g, but is preferably from 0.04 to 0.11 dl/g, more preferably from 0.06 to 0.095 dl/g. When this intrinsic viscosity is too low, the modified polyphenylene ether compound tends to have a low molecular weight, and low dielectric properties such as low dielectric constant and low dielectric loss tangent are less likely to be exhibited. In contrast, when the intrinsic viscosity is too high, the viscosity increases, sufficient fluidity is not exhibited, and the moldability of the cured product tends to be deteriorated. Hence, when the intrinsic viscosity of the modified polyphenylene ether compound is within the range set forth above, excellent heat resistance and moldability of the cured product can be realized.

Note that the intrinsic viscosity as used herein is an intrinsic viscosity measured in methylene chloride at 25° C., and more specifically is, for example, a value such as a measured value of 0.18 g/45 ml methylene chloride solution (at liquid temperature of 25° C.) with a viscometer. Examples of the viscometer include: AVS500 Visco System manufactured by Schott Instruments GmbH.

Note that the polyphenylene ether compound used in the resin composition of the present embodiment can be synthesized by a known method, or a commercially available polyphenylene ether compound can also be used. Examples of the commercially available product include: "OPE-2st 1200" and "OPE-2st 2200" manufactured by Mitsubishi Gas Chemical Company Inc., and "SA 9000" manufactured by SABIC Innovative Plastics.

(Maleimide Resin)

As the maleimide resin that can be used in the present embodiment, a compound that includes a maleimide group in the molecule can be used without particular limitation. Specifically, examples of the maleimide compound include: monofunctional maleimide compounds including one maleimide group in the molecule, polyfunctional maleimide compounds including two or more maleimide groups in the molecule, and modified maleimide compounds. Examples of the modified maleimide compound include: modified maleimide compounds in which a moiety of the molecule is modified with an amine compound, modified maleimide compounds in which a moiety of the molecule is modified with a silicone compound, and modified maleimide compounds in which a moiety of the molecule is modified with an amine compound and a silicone compound.

More specifically, examples include: maleimide compounds having two or more N-substituted maleimide groups in one molecule, maleimide compounds having an indane structure, maleimide compound having at least one selected from among an alkyl group with 6 or more carbon atoms and an alkylene group with 6 or more carbon atoms, and maleimide compounds having a benzene ring in the molecule.

The maleimide compound used in the present embodiment may be commercially available, and for example, there may be used: BMI-4000, BMI-2300, BMI-TMH, BMI-4000, BMI-5100, etc. manufactured by Daiwa Fine Chemicals Co., Ltd.; MIR-3000-70MT and MIR-5000 manufactured by Nippon Kayaku Co., Ltd.; BMI-689, BMI-1500, BMI-3000J, BMI-5000 etc. manufactured by Designer Molecules Inc.

(Hydrocarbon-Based Resin Having Unsaturated Double Bond)

The hydrocarbon-based resin that can be used in the present embodiment is not particularly limited as long as it is a hydrocarbon-based resin having an unsaturated double bond, and for example, there can be preferably exemplified hydrocarbon-based resins of a polyfunctional vinyl aromatic polymer, of a cyclic polyolefin resin, or of a vinyl aromatic compound-conjugated diene-based compound copolymer.

The polyfunctional vinyl aromatic polymer is preferably a polymer including a polymerized product of at least a polyfunctional vinyl aromatic compound and/or a derivative thereof, and is not particularly limited as long as it is a polymer including a structure derived from a polyfunctional vinyl aromatic compound and/or a derivative thereof, and may be a polymer including a structure derived from one or more polyfunctional vinyl aromatic compounds and/or derivatives thereof.

Preferable examples that can be used include a polyfunctional vinyl aromatic copolymer having a structural unit derived from a monomer including a divinyl aromatic compound and an ethyl vinyl aromatic compound.

In the resin composition of the present embodiment, besides the above, examples of the thermosetting resin (B) that can be used include: epoxy resin, cyanate ester resin, phenol resin, active ester resin, benzoxazine resin, and resins having an unsaturated group (acrylic, methacrylic, vinyl, allyl, propenyl) other than the above.

As the epoxy resin, a compound having an epoxy group in the molecule can be used, and specifically, examples thereof include: bixylenol type epoxy resin, bisphenol A type epoxy resin, bisphenol F type epoxy resin, bisphenol S type epoxy resin, bisphenol AF type epoxy resin, dicyclopentadiene type epoxy resin, tris phenol type epoxy resin, naphthol novolac type epoxy resin, phenol novolac type epoxy resin, tert-butyl-catechol type epoxy resin, naphthalene type epoxy resin, naphthol type epoxy resin, anthracene type epoxy resin, glycidyl amine type epoxy resin, glycidyl ester type epoxy resin, cresol novolac type epoxy resin, biphenyl type epoxy resin, linear aliphatic epoxy resin, epoxy resins having a butadiene structure, alicyclic epoxy resin, heterocyclic epoxy resin, spiro ring containing epoxy resin, cyclohexane type epoxy resin, cyclohexanedimethanol type epoxy resin, naphthylene ether type epoxy resin, trimethylol type epoxy resin, and tetraphenylethane type epoxy resin. The epoxy compound also includes an epoxy resin obtained as a polymer of each of the epoxy compounds.

As the cyanate ester resin, a compound having a cyanate group in the molecule can be used, and specifically, examples that can be used include: phenol novolac type cyanate ester compound, naphthol aralkyl type cyanate ester compound, biphenyl aralkyl type cyanate ester compound, naphthylene ether type cyanate ester compound, xylene resin type cyanate ester compound, adamantane skeleton type cyanate ester compound.

As the benzoxazine resin, for example, a benzoxazine compound represented by the following general formula (C-I) can be used.

[Chemical formula 8]

(C-I)

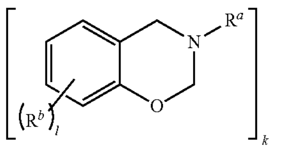

In the formula (C-1), $R^a$ represents a k-valent group, and Rb's each independently represent a halogen atom, an alkyl group, or an aryl group. k represents an integer from 2 to 4, and 1 represents an integer from 0 to 4.

Examples of commercially available products include: "JBZ-OP100D" and "ODA-BOZ" manufactured by JFE Chemical Corporation; "P-d", "F-a", and "ALP-d" manufactured by Shikoku Chemicals Corporation; "HFB2006M" manufactured by Showa Highpolymer Co., Ltd.

As the acrylic resin, a compound having an acryloyl group in the molecule can be used, and examples thereof include: monofunctional acrylate compounds having one acryloyl group in the molecule; and polyfunctional acrylate compounds having two or more acryloyl groups in the molecule. Examples of the monofunctional acrylate compound include: methyl acrylate, ethyl acrylate, propyl acrylate, and butyl acrylate. Examples of the polyfunctional acrylate compound include: diacrylate compounds such as tricyclodecanedimethanol dimethacrylate.

As the methacrylic resin, a compound having a methacryloyl group in the molecule can be used, and examples thereof include: monofunctional methacrylate compounds having one methacryloyl group in the molecule; and polyfunctional methacrylate compounds having two or more methacryloyl groups in the molecule. Examples of the monofunctional methacrylate compound include: methyl methacrylate, ethyl methacrylate, propyl methacrylate, and butyl methacrylate. Examples of the polyfunctional methacrylate compound include: dimethacrylate compounds such as tricyclodecanedimethanol dimethacrylate (DCP).

As the vinyl resin, a compound having a vinyl group in the molecule can be used, and examples thereof include: monofunctional vinyl compounds (monovinyl compounds) having one vinyl group in the molecule; and polyfunctional vinyl compounds having two or more vinyl groups in the molecule. Examples of the polyfunctional vinyl compound include: divinylbenzene; curable polybutadiene having a carbon-carbon unsaturated double bond in the molecule; and curable butadiene-styrene copolymers having a carbon-carbon unsaturated double bond in the molecule.

As the active ester resin, a compound having an ester group having high reaction activity in the molecule can be used, and examples thereof include: benzene carboxylic acid active ester, benzene dicarboxylic acid active ester, benzene tricarboxylic acid active ester, benzene tetracarboxylic acid active ester, naphthalene carboxylic acid active ester, naphthalene dicarboxylic acid active ester, naphthalene tricarboxylic acid active ester, naphthalene tetracarboxylic acid active ester, fluorene carboxylic acid active ester, fluorene dicarboxylic acid active ester, fluorene tricarboxylic acid active ester, and fluorene tetracarboxylic acid active ester.

As the allyl resin, a compound having an allyl group in the molecule can be used, and examples thereof include: triallyl isocyanurate compounds such as triallyl isocyanurate (TAIC), diallyl bisphenol compounds, and diallyl phthalate (DAP).

As the phenol resin, there can be used a compound containing an aromatic ring with hydroxy group in the molecule, and examples thereof include: bisphenol A type phenol resin, bisphenol E type phenol resin, bisphenol F type phenol resin, bisphenol S type phenol resin, phenol novolac resin, bisphenol A novolac type phenol resin, glycidyl ester type phenol resin, aralkyl novolac type phenol resin, biphenyl aralkyl type phenol resin, cresol novolac type phenol resin, polyfunctional phenol resin, naphthol resin, naphthol novolac resin, polyfunctional naphthol resin, anthracene type phenol resin, naphthalene skeleton modified novolac type phenol resin, phenol aralkyl type phenol resin, naphthol aralkyl type phenol resin, dicyclopentadiene type phenol resin, biphenyl type phenol resin, alicyclic phenol resin, polyol type phenol resin, phosphorus-containing phenol resin, polymerizable unsaturated hydrocarbon group-containing phenol resin, and hydroxyl group-containing silicone resins.

As the propenyl resin, for example, propenylbenzene, BPN (manufactured by Gun Ei Chemical Industry Co., Ltd.), and the like can be used.

(Blending Ratio)

Regarding the blending ratio of the compound (A) and the thermosetting resin (B) in the resin composition as described above, the optimum range thereof should be set appropriately in accordance with the type of the compound (A) and/or the type of the thermosetting resin (B). For example, the content of the compound (A) is preferably from 1 to 100 parts by weight, more preferably from 5 to 60 parts by weight with the thermosetting resin (B) being 100 parts by weight.

<Thermoplastic Resin>

Furthermore, the resin composition of the present embodiment may be added with a thermoplastic resin in order to more reliably ensure low dielectric properties, adhesive strength, and the like.

Examples of the thermoplastic resin include: thermoplastic polyphenylene ether resins, polyphenylene sulfide resins, liquid crystal polymers, polyethylene resins, polystyrene resins, polyurethane resins, polypropylene resins, ABS resins, acrylic resins, polyethylene terephthalate resins, polycarbonate resins, polyacetal resins, polyimide resins, polyamideimide resins, polytetrafluoroethylene resins, cycloolefin polymers, cycloolefin copolymers, and styrenic elastomers. The resins may be used singly, or two or more thereof may be used in combination.

Among them, the styrenic elastomer is a polymer obtained by polymerizing a monomer containing a styrenic monomer, and may be a styrenic copolymer. Examples of the styrenic copolymer include: copolymers obtained by copolymerizing one or more species of styrenic monomers and one or more species of other monomers copolymerizable with the styrenic monomers. The styrenic copolymer may be a random copolymer or a block copolymer as long as a structure derived from the styrenic monomer is included in the molecule. Examples of the block copolymer include: binary copolymers of the structure (repeating unit) derived from the styrenic monomer and the other copolymerizable monomer (repeating unit): and ternary copolymers of the structure (repeating unit) derived from the styrenic monomer, the other copolymerizable monomer (repeating unit), and the structure (repeating unit) derived from the styrenic monomer.

The styrenic elastomer may be a hydrogenated styrenic copolymer obtained by hydrogenating the styrenic copolymer.

As the styrenic elastomer, one species of styrene polymer may be used singly, or two or more species thereof may be used in combination.

As the styrenic elastomer, there may be used an acid anhydride-modified styrenic elastomer obtained by modifying a moiety of the molecule with an acid anhydride.

The styrenic elastomer preferably has a weight average molecular weight of 1000 to 300000, more preferably 1200 to 200000. When the molecular weight is too low, a cured product of the resin composition tends to have a decreased glass transition temperature or to be deteriorated in heat resistance. When the molecular weight is too high, the viscosity of the resin composition when varnished and the viscosity of the resin composition during heat molding tend to be too high. Note that the weight average molecular weight is preferably a measured value by a general molecular weight measurement method, and specifically, examples thereof include a value measured by gel permeation chromatography (GPC).

As the styrenic elastomer, a commercially available product can be used, and for example, there may be used: V9827, V9461, 2002, 8007, 8076, and 7125F manufactured by Kuraray Co., Ltd.; FTR2140 and FTR6125 manufactured by Mitsui Chemicals, Inc.; and H1517, H1041, and H1221 manufactured by Asahi Kasci Corporation.

<Inorganic Filler>

The resin composition according to the present embodiment may further contain an inorganic filler. The inorganic filler is not particularly limited and there can be exemplified an inorganic filler to be added in order the cured product of a resin composition to be enhanced in heat resistance and flame retardancy. The inclusion of the inorganic filler is thought to be able to enhance heat resistance, flame retardancy, and the like, and also to keep down the coefficient of thermal expansion.

Specifically, examples of the inorganic filler that can be used in the present embodiment include: metal oxides such as silica, alumina, titanium oxide, magnesium oxide, and mica, metal hydroxides such as magnesium hydroxide and aluminum hydroxide, talc, aluminum borate, barium sulfate, aluminum nitride, boron nitride, titanium oxide, barium titanate, strontium titanate, calcium titanate, aluminum titanate, barium zirconate titanate, barium zirconate, calcium zirconate, zirconium phosphate, and phosphorus zirconium tungstate, magnesium carbonate such as anhydrous magnesium carbonate, and boehmite treated product thereof. Preferable examples among them include: silica, metal hydroxides such as magnesium hydroxide and aluminum hydroxide, aluminum oxide, boron nitride, barium titanate, and strontium titanate, and silica is more preferable. The silica is not particularly limited, and examples thereof include: crushed silica, spherical silica, and silica particles.

One kind out of these inorganic fillers may be used singly, or two or more kinds thereof may be used in combination. In addition, the inorganic fillers as described above may be used as they are, but they may be used after having undergone surface treatment with an epoxy silane type, a vinyl silane type, a methacryl silane type, a phenylamino silane type, or an amino silane type silane coupling agent. The silane coupling agent may also be used by adding in an integral blend method instead of using in a method of surface treating the filling material in advance.

When the resin composition of the present embodiment contains an inorganic filler, the content thereof is preferably about from 10 to 300 parts by mass, and more preferably about from 40 to 250 parts by mass, relative to 100 parts by mass of the total mass of the compound (A), the thermosetting resin (B), and the thermoplastic resin.

<Other Components>

The resin composition according to the present embodiment may further contain components (other components) apart from the above-described components, as necessary, as long as the effects of the present invention are not impaired. Examples of other components contained in the resin composition according to the present embodiment may further include: catalysts such as a reaction initiator and a reaction accelerator; and additives such as a silane coupling agent, a polymerization inhibitor, a polymerization retarder, an antifoaming agent, a leveling agent, an antioxidant, a heat stabilizer, an antistatic agent, an ultraviolet absorber, a dye and a pigment, a dispersant, and a lubricant.

The resin composition according to the present embodiment may contain a catalyst as described above. The catalyst is not particularly limited as long as it can accelerate the curing reaction of the resin composition. Specifically, examples thereof include: metal oxides, azo compounds, peroxides, imidazole compounds, phosphorus-based curing accelerators, and amine-based curing accelerators.

Specifically, examples of the metal oxide include: zinc octylate, tin octylate, zinc naphthenate, cobalt naphthenate, tin stearate, and zinc stearate.

Examples of the peroxide include: α,α'-di(t-butylperoxy)diisopropylbenzene, 2,5-dimethyl-2,5-di(t-butylperoxy)-3-hexyne, benzoyl peroxide, 3,3',5,5'-tetramethyl-1,4-diphenoquinone, chloranil, 2,4,6-tri-t-butylphenoxyl, t-butylperoxyisopropyl monocarbonate, and azobisisobutyronitrile.

Specifically, examples of the azo compound include: 2,2'-azobis(2,4,4-trimethylpentane), 2,2'-azobis(N-butyl-2-methylpropionamide), and 2,2'-azobis(2-methylbutyronitrile).

As a preferable reaction initiator among them, α,α'-di(t-butylperoxy)diisopropylbenzene is preferably used. α,α'-Di(t-butylperoxy)diisopropylbenzene has low volatility and hence does not volatilize in drying and storage, so that its stability is excellent. Moreover, the reaction initiation temperature for α,α'-di(t-butylperoxy)diisopropylbenzene is relatively high, and hence the promotion of the curing reaction can be suppressed at a time point when curing is not required, for example, at a time of drying a prepreg. The suppression of this curing reaction enables to suppress the deterioration of storage stability of the resin composition.

Examples of the phosphorus-based curing accelerator include: triphenylphosphine, phosphonium borate compounds, tetraphenylphosphonium tetraphenylborate, n-butylphosphonium tetraphenylborate, tetrabutylphosphonium decanoate, (4-methylphenyl)triphenylphosphonium thiocyanate, tetraphenylphosphonium thiocyanate, and butyltriphenylphosphonium thiocyanate.

Examples of the amine-based curing accelerator include: trialkylamines such as triethylamine and tributylamine, 4-dimethylaminopyridine (DMAP), benzyldimethylamine, 2,4,6-tris(dimethylaminomethyl)phenol, and 1,8-diazabicyclo[5.4.0]undecene.

Examples of the imidazole-based compound include imidazole compounds such as: 2-methylimidazole, 2-undecylimidazole, 2-heptadecylimidazole, 1,2-dimethylimidazole, 2-ethyl-4-methylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, I-cyanoethyl-2- phenylimidazolium trimellitate, 2,4-diamino-6-[2'-methylimidazolyl-(1')]-ethyl-s-triazine, 2,4-diamino-6-[2'-undecylimidazolyl-(1')]-ethyl-s-triazine, 2,4-diamino-6-[2'-ethyl-4'-methylimidazolyl-(1')]-ethyl-s-triazine, 2,4-diamino-6-[2'-methylimidazolyl-(1')]-ethyl-s-triazine isocyanuric acid adduct, 2-phenylimidazole isocyanuric acid adduct, 2-phenyl-4,5-dihydroxymethylimidazole, 2-phenyl-4-methyl-5-hydroxymethylimidazole, 2,3-dihydro-1H-pyrrolo[1,2-a]benzimidazole, 1-dodecyl-2-methyl-3-benzylimidazolium chloride, 2-methylimidazoline, and 2-phenylimidazoline.

The above-described catalysts may be used singly or in combination of two or more kinds thereof.

<Prepreg, Film with Resin, Metal-Clad Laminate, Wiring Board, and Metal Foil with Resin>

Next, there will be described a prepreg, a metal-clad laminate, a wiring board, and a metal foil with resin, for wiring board with use of the resin composition of the present embodiment. Note that, in the following description, each reference numeral denotes as follows: 1 prepreg, 2 resin composition or semi-cured product of resin composition, 3 fibrous base material, 11 metal-clad laminate, 12 insulating layer, 13 metal foil, 14 wiring, 21 wiring board, 31 metal foil with resin, 32, 42 resin layer, 41 film with resin, and 43 support film.

FIG. 1 is a schematic sectional view illustrating an example of a prepreg 1 according to an embodiment of the present invention.

As illustrated in FIG. 1, the prepreg 1 according to the present embodiment includes: the resin composition or a semi-cured product of the resin composition 2; and a fibrous base material 3. As the prepreg 1, there is exemplified the resin composition or a semi-cured product 2 thereof in which the fibrous base material 3 is present. In other words, the prepreg 1 includes: the resin composition or semi-cured product thereof; and the fibrous base material 3 present in the resin composition or semi-cured product 2 thereof.

Note that, in the present embodiment, the "semi-cured product" is the resin composition that is partway cured to a state which can be further cured. That is, the semi-cured product is the resin composition in a semi-cured state (B-staged). For example, when a resin composition is heated, the viscosity of the resin composition first gradually decreases, thereafter curing begins, and the viscosity gradually increases. In such a case, as the semi-cured state, there is exemplified a state between after the viscosity has started to increase and before it completely cured, for example.

The resultant prepreg with use of the resin composition according to the present embodiment may be a prepreg including a semi-cured product of the resin composition as described above, or may be a prepreg including the uncured resin composition itself. In other words, the prepreg may be a prepreg including a semi-cured product of the resin composition (the resin composition in B stage) and a fibrous base material, or may be a prepreg including the resin composition before curing (the resin composition in A stage) and a fibrous base material. Specifically, examples of the prepreg include: a prepreg in which a fibrous base material is present in the resin composition. Note that, a resin composition or semi-cured product thereof may be a product obtained by heating and drying the resin composition.

When producing the prepreg and the metal foil with resin, metal-clad laminate and the like to be described later, the resin composition according to the present embodiment is often prepared in the form of a varnish and used as a resin varnish. Such a resin varnish is prepared, for example, as follows.

First, each component which is soluble in an organic solvent, such as a resin component and a reaction initiator, is put into an organic solvent and dissolved. At this time, the mixture may be heated as necessary. Thereafter, a component which is not soluble in an organic solvent, such as an inorganic filler, is added thereto and the mixture is dispersed with a ball mill, a bead mill, a planetary mixer, a roll mill or the like until it becomes a predetermined dispersion state, thereby preparing a varnish-like resin composition. The organic solvent used herein is not particularly limited as long as it dissolves the compound (A) and the thermosetting resin (B), and if needed, the reactive compound and the like, and does not inhibit the curing reaction. Specifically, examples thereof include: toluene, methyl ethyl ketone, cyclohexanone, cyclopentanone, methylcyclohexane, dimethylformamide, and propylene glycol monomethyl ether acetate. These may be used singly or two or more kinds thereof may be used in combination.

Examples of the method of producing the prepreg 1 of the present embodiment with use of the varnish-like resin composition of the present embodiment include: a method in which the fibrous base material 3 is impregnated with the resin composition 2 in the form of a resin varnish followed by drying.

Specifically, examples of the fibrous base material used in fabrication of the prepreg include: glass cloth, aramid cloth, polyester cloth, LCP (liquid crystal polymer) nonwoven fabric, glass nonwoven fabric, aramid nonwoven fabric, polyester nonwoven fabric, pulp paper, and linter paper. Note that, when glass cloth is used, a laminate excellent in mechanical strength is obtained, and glass cloth processed to be flattened is particularly preferable. The glass cloth used in the present embodiment is not particularly limited, but examples thereof include: glass cloth with low dielectric constant such as E glass, S glass, NE glass, Q glass, and L glass. Specifically, the flattening process can be carried out, for example, the glass cloth is continuously pressed with press rolls at an appropriate pressure and the yarn is flattened. Note that, a fibrous base material having a thickness of 0.01 to 0.3 mm, for example, can be generally used.

The fibrous base material 3 is impregnated with the resin varnish (resin composition 2) by dipping, coating, or the like. This impregnation can be repeated multiple times if necessary. At this time, the composition (content ratio) and resin amount can be adjusted to the desired values eventually by repeating the impregnation with a plurality of resin varnishes having different compositions and concentrations.

The fibrous base material 3 impregnated with the resin varnish (resin composition 2) is heated under desired heating conditions, for example, at 80° C. or more and 180° C. or less for 1 minute or more and 10 minutes or less. By heating, the solvent is volatilized from the varnish to reduce or remove the solvent, so that the prepreg 1 before curing (in A stage) or in a semi-cured state (B stage) is obtained.

Figure 4:
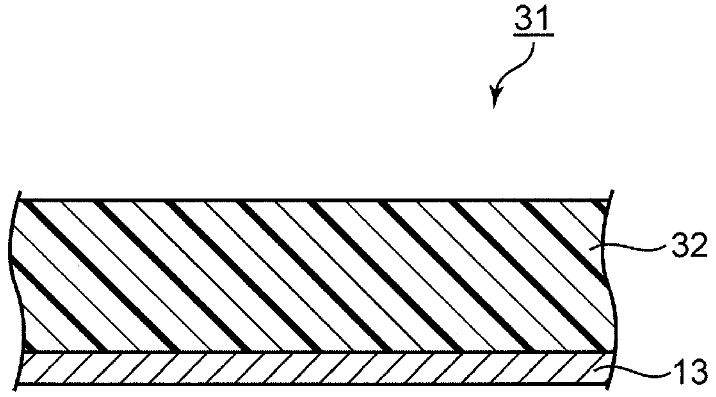
FIG. 4 is a schematic sectional view illustrating the configuration of a metal foil with resin according to an embodiment of the present invention.

As illustrated in FIG. 4, a metal foil with resin 31 of the present embodiment has a configuration in which a resin layer 32 containing the resin composition described above or a semi-cured product of the resin composition; and a metal foil 13 are laminated. In other words, the metal foil with resin of the present embodiment may be a metal foil with resin including a resin layer containing the resin composition before curing (the resin composition in A stage) and a metal foil, or may be a metal foil with resin including a resin layer containing a semi-cured product of the resin composition (the resin composition in B stage) and a metal foil.

Examples of the method for fabricating such a metal foil with resin 31 include a method in which a resin composition in the form of a resin varnish as described above is applied to the surface of the metal foil 13 such as a copper foil followed by drying. Examples of the coating method include a bar coater, a comma coater, a die coater, a roll coater, and a gravure coater.

As the metal foil 13, metal foils used in metal-clad laminates, in wiring boards and the like can be used without limitation, and examples thereof include copper foil and aluminum foil.

Figure 5:
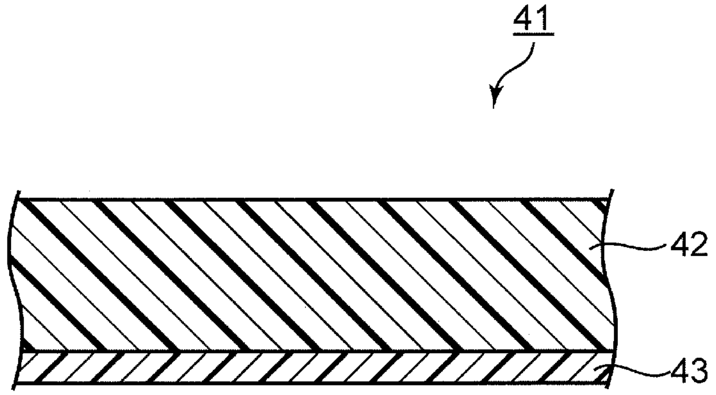
FIG. 5 is a schematic sectional view illustrating the configuration of a resin film according to an embodiment of the present invention.

As illustrated in FIG. 5, a film with resin 41 of the present embodiment has a configuration in which a resin layer 42 containing the resin composition described above or a semi-cured product of the resin composition; and a film-supporting base material 43 are laminated. In other words, the film with resin of the present embodiment may be a film with resin in which the resin composition before curing (the resin composition in A stage) and a film-supporting base material are included, or may be a film with resin in which a semi-cured product of the resin composition (the resin composition in B stage); and a film-supporting base material are included.

As the method of fabricating such a film with resin 41, for example, a resin composition in the form of a resin varnish as described above is applied onto the surface of the film-supporting base material 43, and then the solvent is volatilized from the varnish to reduce the solvent or to remove the solvent, thereby enabling to obtain a film with resin before curing (A stage) or in a semi-cured state (B stage).

Examples of the film-supporting base material include: electrical insulating films such as a polyimide film, a PET (polyethylene terephthalate) film, a polyester film, a poly (parabanic acid) film, a polyether ether ketone film, a polyphenylene sulfide film, an aramid film, a polycarbonate film, and a polyarylate film.

Note that, also in the film with resin and metal foil with resin of the present embodiment, the resin composition or semi-cured product thereof may be one obtained by drying or heating and drying the resin composition as in the prepreg described above.

The thickness and the like of the metal foil 13 and the film-supporting base material 43 can be appropriately set depending on the desired purpose. For example, as the metal foil 13, a metal foil having a thickness of about 0.2 to 70 μm can be used. In a case where the thickness of metal foil is, for example, 10 μm or less, the metal foil may be a copper foil with carrier including a release layer and a carrier in order to improve handleability. The application of the resin varnish to the metal foil 13 and the film-supporting base material 43 is performed by coating or the like, and this can be repeated multiple times if necessary. At this time, the composition (content ratio) and resin amount can be adjusted to the desired values eventually by repeating the application with a plurality of resin varnishes having different compositions and concentrations.

The drying or heat-drying conditions in the method for producing the metal foil with resin 31 and the resin film 41 are not particularly limited, but the metal foil with resin 31 and the resin film 41 before curing (stage A) or in a semi-cured state (stage B) are obtained by applying the resin composition in the form of resin varnish to the metal foil 13 and the film-supporting base material 43, and then heating under desired heating conditions, for example, at 50 to 180° C. for about 0.1 to 10 minutes to volatilize the solvent from the varnish to reduce or remove the solvent.

The metal foil with resin 31 and resin film 41 may include a cover film and the like if necessary. When a cover film is provided, foreign matter inclusion and the like can be prevented. The cover film is not particularly limited as long as it can be peeled off without damaging the form of the resin composition, and examples thereof that can be used include: polyolefin films, polyester films, TPX films, films formed provided with a mold releasing agent layer on these films, and paper obtained by laminating these films on a paper base material can be used.

Figure 2:
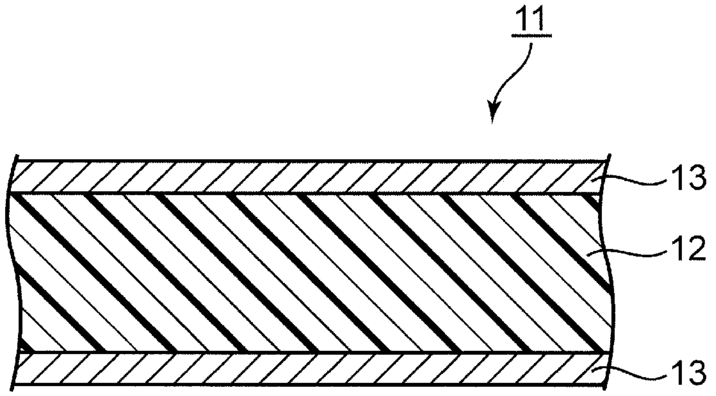
FIG. 2 is a schematic sectional view illustrating the configuration of a metal-clad laminate according to an embodiment of the present invention.

As illustrated in FIG. 2, a metal-clad laminate 11 of the present embodiment includes: an insulating layer 12 containing a cured product of the resin composition described above or a cured product of the prepreg described above; and a metal foil 13. Note that, as the metal foil 13 used in the metal-clad laminate 11, a metal foil similar to the metal foil 13 described above can be used.

The metal-clad laminate 11 of the present embodiment can also be fabricated by using the metal foil with resin 31 or resin film 41 described above.

As the method for fabricating a metal-clad laminate using the prepreg 1, metal foil with resin 31, or resin film 41 obtained in the manner described above, one or a plurality of prepregs 1, metal foil with resin 31, or resin films 41 are superimposed on one another, and the metal foils 13 such as copper foil are further superimposed on both upper and lower sides or on one side, and this is laminated and integrated by heating and pressing, whereby a double-sided metal-clad or single-sided metal-clad laminate can be fabricated. The heating and pressurizing conditions can be appropriately set in accordance with the thickness of the laminate to be produced, the type of the resin composition, and the like, and for example, the temperature can be set to 170 to 230° C., the pressure can be set to 1.5 to 5.0 MPa, and the time can be set to 60 to 150 minutes.

The metal-clad laminate 11 may be fabricated without using the prepreg 1 or the like by forming a film-like resin composition on the metal foil 13 and performing heating and pressing.

Figure 3:
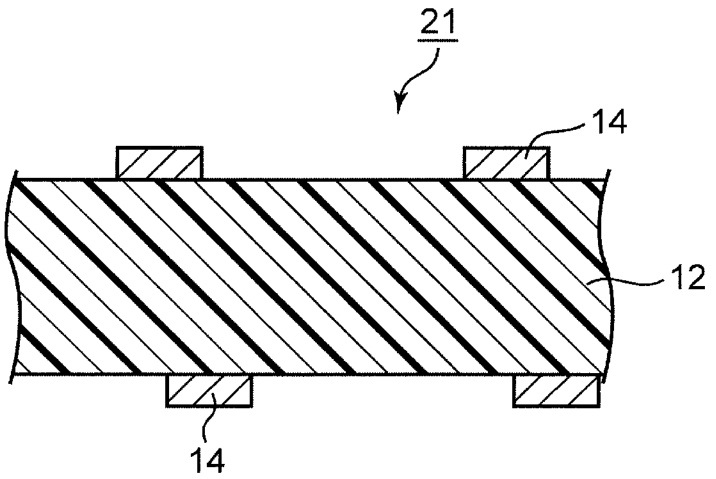
FIG. 3 is a schematic sectional view illustrating the configuration of a wiring board according to an embodiment of the present invention.

As illustrated in FIG. 3, a wiring board 21 of the present embodiment includes wiring 14 and an insulating layer 12 containing a cured product of the resin composition described above or a cured product of the prepreg described above.

The resin composition of the present embodiment is suitably used as a material for an insulating layer of a wiring board. As the method for fabricating the wiring board 21, for example, the metal foil 13 on the surface of the metal-clad laminate 11 obtained above is etched to form a circuit (wiring), thereby enabling to obtain the wiring board 21 having a conductor pattern (wiring 14) provided as a circuit on the surface of a laminate. Examples of the circuit forming method include circuit formation by a semi additive process (SAP) or a modified semi additive process (MSAP) in addition to the method described above.

A prepreg, a film with resin, and a metal foil with resin obtained by using the resin composition of the present embodiment are very useful for industrial use since the cured products thereof are excellent in low dielectric properties and flame retardancy, and have a high Tg. In addition, the metal-clad laminate and the wiring board obtained by curing them also have advantages that they are excellent in low dielectric properties and flame retardancy and have a high Tg.

Hereinafter, the present invention will be described more specifically with reference to Examples, but the scope of the present invention is not limited thereto.

EXAMPLES

Synthesis of Compound (A)

Production Example 1

Production of 9,10-dihydro-9-oxa-10-phospha-phenanthrene-10-trityl-10-oxide (Organic compound 1)

Into a 300 ml inner volume four-necked flask of hard glass equipped with a stirrer, a thermometer, a reflux condenser, and a gas inlet port were charged 21.6 g (Mw: 216.2×0.1 mol) of 9,10-dihydro-9-oxa-10-phosphaphenanthrene-10-oxide and 183 g of acetonitrile.

While blowing nitrogen gas from the gas inlet port, the temperature was raised, and at the time when the temperature raised up to 70° C., trityl chloride was started to be added portionwise. After 9.3 g of the first portion of trityl chloride had been added, thereafter an operation of adding 9.3 g of trityl chloride was repeated per hour, and a total amount of 27.9 g (Mw: 278.8×0.1 mol) of trityl chloride was added portionwise.

After the portionwise addition had been completed, the temperature of the reactor was set to 80° C., the mixture underwent dehydrochlorination aging reaction for 24 hours, and then cooling was started. At the time when the reactor temperature went down to about 25° C., the precipitated crystals were filtrated under reduced pressure, and then the filtrated crystals were washed with purified water, and the washing operation was continued until the filtrate showed almost neutral pH, followed by drying.

Through the above operations, 44.4 g of white crystal of organic compound 1 (Mw 458.5) having a melting point of about 250° C. was obtained.

Figure 6:
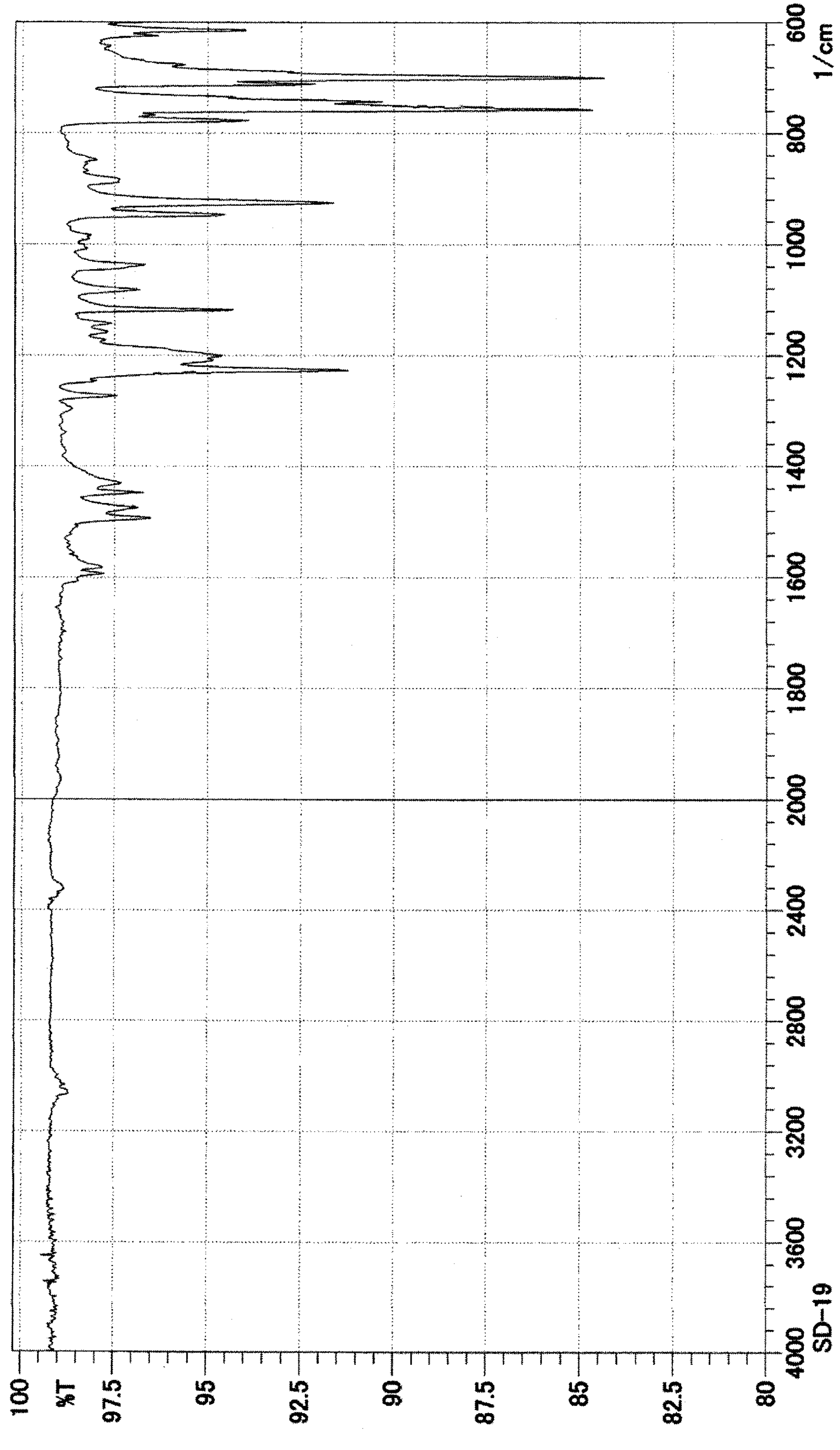
FIG. 6 is an infrared absorption spectrum (IR) of an organic compound 1 obtained in Production Example 1.
Figure 7:
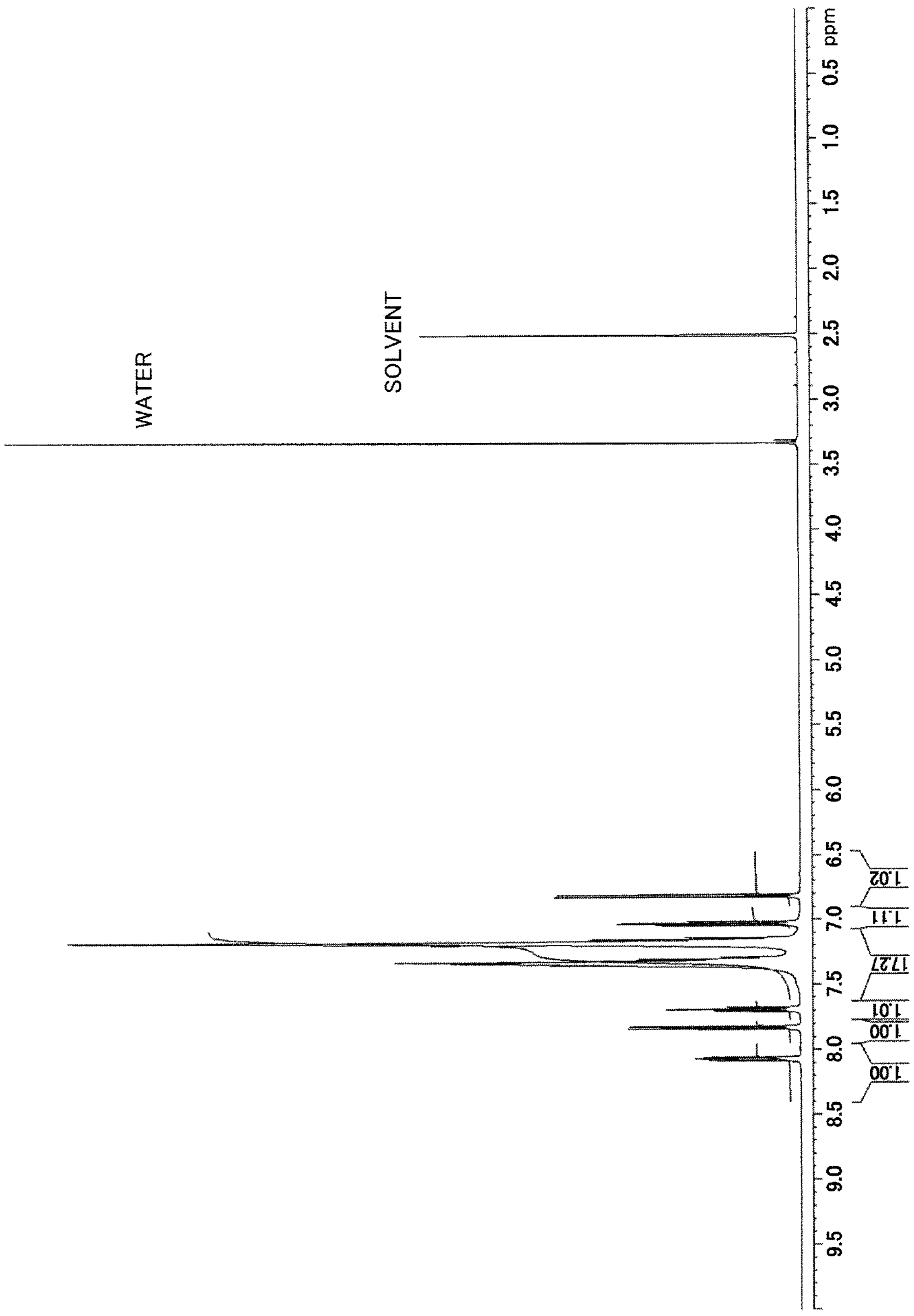
FIG. 7 is a 1H-NMR spectrogram of an organic compound 1 obtained in Production Example 1.
Figure 8:
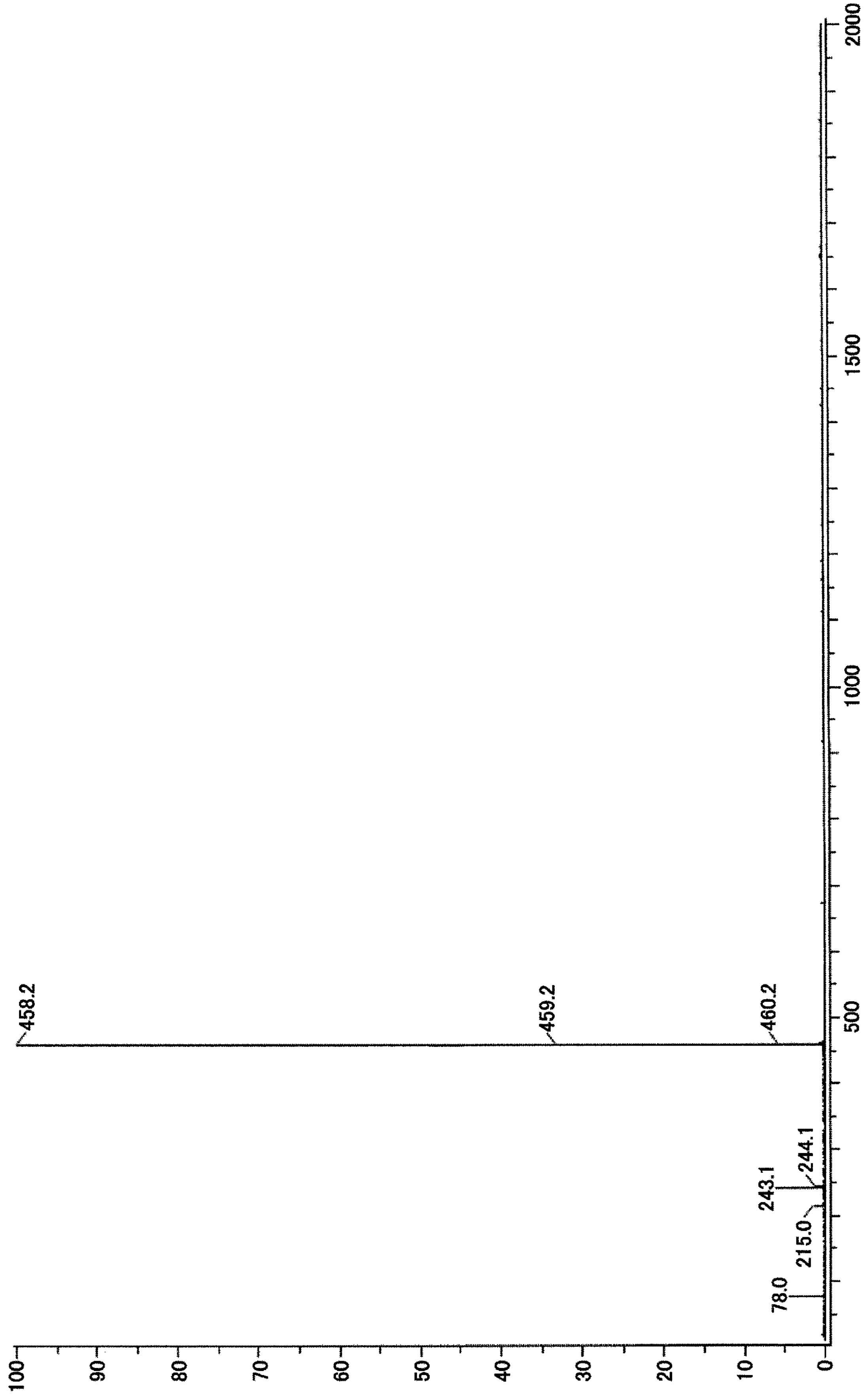
FIG. 8 is an FD-MS spectrogram of an organic compound 1 obtained in Production Example 1.

This organic compound 1 was confirmed to have a purity of 99% by liquid chromatographic (LC) analysis, and its infrared (IR) absorption spectrum was as shown in FIG. 6, 1H-NMR was as shown in FIG. 7, and FD-MS was as shown in FIG. 8, and the resultant organic compound 1 was confirmed to be a compound having the following chemical structure.

[Chemical formula 9]

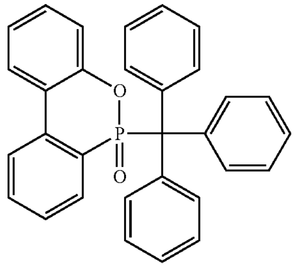

<Other Flame Retardants>

- Flame retardant 1: Aromatic condensed phosphoric acid ester ("PX-200" manufactured by Daihachi Chemical Industry Co., Ltd.)
- Flame retardant 2: Phosphazene compound ("FP-100" manufactured by FUSHIMI Pharmaceutical Co., Ltd.)
- Flame retardant 3: Aluminum phosphinate ("OP-935" manufactured by Clariant AG)
- Flame retardant 4: Melamine polyphosphate ("Melapur 200/70" manufactured by BASF Japan Ltd.)

<Thermosetting Resin Component>

- Polyphenylene ether compound: Modified polyphenylene ether compound obtained by modifying terminal hydroxyl group of polyphenylene ether with methacryloyl group ("SA 9000" manufactured by SABIC Innovative Plastics, weight average molecular weight Mw: 2000, number of terminal functional groups: 2)
- Allyl compound: Triallyl isocyanurate ("TAIC" manufactured by Nippon Kasei Chemical Co., Ltd.)

<Thermoplastic Resin Component>

- Styrenic elastomer resin ("Septon V9827" manufactured by Kuraray Co., Ltd.)

<Other Components>

- Catalyst 1: PBP (1,3-bis(butylperoxyisopropyl)benzene ("PERBUTYL P(PBP)" manufactured by NOF CORPORATION)
- Inorganic filler 1: Spherical silica treated with vinylsilane (silica particles "SC2300-SVJ" manufactured by Admatechs Company Limited)

Examples 1 to 2 and Comparative Examples 1 to 4

[Preparation Method] (Resin Varnish)

First, each of the above components other than the compound (A) and the inorganic filler was added to toluene so as to have a solid content concentration of 40 to 65% by mass with the composition (parts by mass) described in Table 1, and mixed. The mixture was stirred for 60 minutes. Thereafter, the compound (A) and an inorganic filler were added to the obtained liquid and dispersed in advance with a stirrer, and then the filler was dispersed with a bead mill. By doing so, a varnish-like resin composition (varnish) was obtained.

(Evaluation Sample)

Next, a prepreg and an evaluation substrate (metal-clad laminate) were obtained as follows.

A fibrous base material (Glass cloth: #2116 type, E glass manufactured by Nitto Boseki Co., Ltd.) was impregnated with the obtained varnish, and then heated and dried at 120° C. for 3 minutes to prepare a prepreg. At that time, the content (resin content) of the component constituting the resin composition by the curing reaction with respect to the prepreg was adjusted to be 45% by mass.

Next, an evaluation substrate (metal-clad laminate) was obtained as follows.

Four sheets of the resulting prepregs were stacked, and copper foils (3EC-VLP manufactured by Mitsui Mining & Smelting Corporation, thickness: 12 μm) were disposed on both sides of the stacked prepregs. This was used as a body to be pressed, heated to a temperature of 200° C. at a heating rate of 2° C./min, and heated and pressed under conditions of 200° C., 120 minutes, and a pressure of 2 MPa, thereby obtaining an evaluation substrate (metal-clad laminate) having a thickness of about 400 μm and having copper foils bonded to both surfaces.

<Evaluation Test>

Using an unclad plate obtained by removing a copper foil from the evaluation substrate obtained above by etching, the combustibility (average seconds) was evaluated in accordance with the combustibility test of UL 94. Specifically, the average seconds until the fire went out was measured in a total of 10 times of flame application in which a test flame was applied twice to five evaluation substrate, and the average value thereof was calculated. As the evaluation criteria, 25 seconds or less was accepted. In the table, "Complete combustion" means a state in which the flame rises from the lower end at which the test flame is applied to the chucked upper end of the evaluation substrate, and the evaluation substrate is in a combustion state.

(Dielectric Properties: Dielectric Loss Tangent (Df))

The dielectric loss tangent of the evaluation substrate at 10 GHz was measured by a cavity resonator perturbation method using an unclad plate obtained by removing a copper foil from the evaluation substrate by etching. Specifically, the dielectric loss tangent (Df) of the evaluation substrate at 10 GHz was measured using a network analyzer (N5230A manufactured by Agilent Technologies). In this test, a test piece having a Df of 0.006 or less was evaluated to be accepted.

(Glass Transition Temperature (Tg))

Tg was measured with a viscoelastic spectrometer "DMS100" manufactured by Seiko Instruments Inc., by using an unclad plate obtained by removing a copper foil by etching from the evaluation substrate. At this time, dynamic viscoelasticity measurement (DMA) was performed with a tensile module at a frequency of 10 Hz, and Tg was defined as the temperature at which tan 6 showing maximum in a condition when the temperature was raised from room temperature up to 320° C. at a heating rate of 5° C./min. In this test, Tg of 250° C. or higher was evaluated to be accepted.

The results are presented in Table 1.

In order to express the present invention, the present invention has been described above appropriately and sufficiently through the embodiments with reference to specific examples, drawings and the like. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

The present invention has wide industrial applicability in technical fields such as electronic materials, electronic devices, and optical devices.

The invention claimed is:

1. A resin composition comprising:

a compound (A) represented by the following chemical structure:

TABLE 1

| | | | Example 1 | Example 2 | Comparative Example 1 | Comparative Example 2 | Comparative Example 3 | Comparative Example 4 |
|---|---|---|---|---|---|---|---|---|
| Component | | | | | | | | |
| Thermosetting resin | Polyphenylene ether compound | SA9000 | 70 | 35 | 70 | 70 | 70 | 70 |
| | Allyl compound | TAIC | 30 | 35 | 30 | 30 | 30 | 30 |
| Thermoplastic resin | Styrenic elastomer | SeptonV9827 | | 30 | | | | |
| Catalyst | Catalyst 1 | PBP | 2 | 2 | 2 | 2 | 2 | 2 |
| Inorganic filler | Inorganic filler 1 | SC2300-SVJ | 100 | 250 | 100 | 100 | 100 | 100 |
| Flame retardant | Compound (A) | | 42.5 | 59 | | | | |
| | Phosphoric acid ester | PX-200 | | | | 29.2 | | |
| | Phosphazene | FP-100 | | | | | 20.4 | |
| | Aluminum phosphinate | OP-935 | | | | | | 3.5 |
| | Melamine polyphosphate | Melapur200/70 | | | | | | 12 |
| | Phosphorus content | | 2% | 2.5% | 0% | 2% | 2% | 2% |
| Evaluation | | | | | | | | |
| Test | Flame retardancy (average seconds) | | 14 | 3 | Complete combustion | 2 | 3 | 3 |
| | Tg | | 262 | 254 | 271 | 200 | 223 | 270 |
| | Df | | 0.0052 | 0.0035 | 0.0052 | 0.048 | 0.0062 | 0.0061 |

DISCUSSION

As is apparent from the results in Table 1, the evaluation substrates using the resin compositions of Examples had satisfactory results in all of the flame retardancy, the Tg, and the low dielectric properties.

In contrast, the evaluation substrate using the resin composition of Comparative Example 1 to which a flame retardant was not added did not have flame retardancy, and in Comparative Examples 2 to 4 in which a conventional flame retardant was used other than the compound (A) of the present invention, sufficient low dielectric properties could not be obtained, and in Comparative Example 2 to 3, a higher Tg could not be obtained.

This application is based on Japanese Patent Application No. 2021-81741 filed on May 13, 2021, the contents of which are included in the present application.

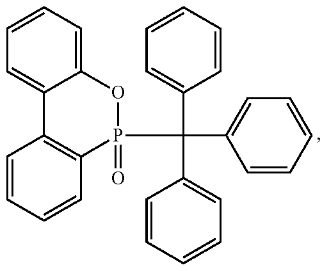 [SMILES: O=P1(C(c2ccccc2)(c2ccccc2)c2ccccc2)Oc2ccccc2-c2ccccc21]

, a thermosetting resin (B) containing at least one selected from among an epoxy resin, a polyphenylene ether resin, a cyanate ester resin, a phenol resin, an active ester resin, a benzoxazine resin, a maleimide resin, an acrylic resin, a methacrylic resin, a vinyl resin, an allyl resin, a propenyl resin, and a hydrocarbon-based resin having an unsaturated double bond.

2. The resin composition according to claim 1, wherein the thermosetting resin (B) contains at least one selected from among a polyphenylene ether resin, a maleimide resin, and a hydrocarbon-based resin having an unsaturated double bond.

3. A prepreg comprising: the resin composition according to claim 1 or a semi-cured product of the resin composition according to claim 1; and a fibrous base material.

4. A film with resin, comprising: a resin layer containing the resin composition according to claim 1 or a semi-cured product of the resin composition according to claim 1; and a support film.

5. A metal foil with resin comprising:
a resin layer containing the resin composition according to claim 1 or a semi-cured product of the resin composition according to claim 1; and
a metal foil.

6. A metal-clad laminate comprising:
an insulating layer containing a cured product of the resin composition according to claim 1; and
a metal foil.

7. A wiring board comprising:
an insulating layer containing a cured product of the resin composition according to claim 1; and
wiring.

8. A metal-clad laminate comprising:
an insulating layer containing a cured product of the prepreg according to claim 3; and
a metal foil.

9. A wiring board comprising:
an insulating layer containing a cured product of the prepreg according to claim 3; and
wiring.

* * * * *